United States Patent
Igarashi et al.

(12)
(10) Patent No.: US 6,523,164 B2
(45) Date of Patent: Feb. 18, 2003

(54) METHOD AND APPARATUS FOR MODIFYING FLATTENED DATA OF DESIGNED CIRCUIT PATTERN

(75) Inventors: Shunji Igarashi, Kawasaki (JP); Kazunori Koike, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 09/771,693

(22) Filed: Jan. 30, 2001

(65) Prior Publication Data

US 2002/0032899 A1 Mar. 14, 2002

(30) Foreign Application Priority Data

Aug. 7, 2000 (JP) ........................................ 2000-238152

(51) Int. Cl.$^7$ ............................ G06F 17/50; G06F 19/00
(52) U.S. Cl. .................................. 716/21; 716/2; 716/7; 700/98; 700/105; 700/120; 700/121; 430/5; 378/35; 382/144
(58) Field of Search .................. 716/1–21; 700/96–105, 700/108–110, 117–121; 430/4–5; 378/34–35; 382/144

(56) References Cited

U.S. PATENT DOCUMENTS

| | | | | |
|---|---|---|---|---|
| 4,669,123 A | * | 5/1987 | Kobayashi et al. | ......... 382/144 |
| 4,701,859 A | * | 10/1987 | Matsuyama et al. | ........ 382/144 |
| 4,912,644 A | * | 3/1990 | Aoyama et al. | .............. 700/98 |
| 5,533,148 A | * | 7/1996 | Sayah et al. | ................. 382/240 |
| 5,789,120 A | * | 8/1998 | Jang et al. | ....................... 430/5 |
| 5,909,376 A | * | 6/1999 | Scepanovic et al. | ........... 716/5 |
| 5,968,692 A | * | 10/1999 | Kasai et al. | .................... 430/30 |
| 6,064,807 A | * | 5/2000 | Aral et al. | ..................... 716/21 |
| 6,303,251 B1 | * | 10/2001 | Mukai et al. | ................... 430/5 |
| 6,353,922 B1 | * | 3/2002 | Dick | ........................... 716/21 |
| 6,381,358 B1 | * | 4/2002 | Vecca et al. | ................. 382/145 |
| 6,397,373 B1 | * | 5/2002 | Tseng et al. | .................... 716/5 |

FOREIGN PATENT DOCUMENTS

| | | | | |
|---|---|---|---|---|
| JP | | 5-74943 | 3/1993 | ........... H01L/21/82 |
| JP | | 8-286358 A | * 11/1996 | |

OTHER PUBLICATIONS

NN8901248, "Scan Line Algorithm for Layout Compactor of Integrated Cicuits", IBM Technical Disclosure Bullentin, vol. 31, No. 8, Jan. 1989, pp. 248–251 (6 pages).*

* cited by examiner

*Primary Examiner*—Vuthe Siek
*Assistant Examiner*—Phallaka Kik
(74) *Attorney, Agent, or Firm*—Staas & Halsey LLP

(57) ABSTRACT

Grouping is performed by classifying the data of features having same shapes and sizes in the same layer into the same group. In the grouping, a feature size having lengths of two adjacent sides of a rectangle inscribed by the feature is obtained to attach the size to the feature data, and if feature data has the same kind, layer and size, the same group name is attached to the feature data. When a feature data is selected by an operator to modify it, the other feature data having the same group name are automatically modified in the same manner.

6 Claims, 9 Drawing Sheets

FIG.2

| NO. | KIND | LAYER | COORDINATES | SIZE | GROUP |
|---|---|---|---|---|---|
| 1 | REC | 1 | X1,Y1,X2,Y2 | W1,H1 | G1 |
| 2 | POL | 1 | X3,Y3, ··· | W2,H2 | G2 |
| 3 | REC | 1 | X4,Y4,X5,Y5 | W3,H3 | G1 |
| 4 | REC | 2 | X6,Y6,X7,Y7 | W4,H4 | G3 |
| 5 | PTH | 3 | X8,Y8,X9,Y9 | L1 | G4 |
| ⋮ | ⋮ | ⋮ | ⋮ | ⋮ | ⋮ |
| n | POL | 1 | Xa,Ya, ··· | Wa,Ha | G2 |

FIG. 6
(Prior Art)
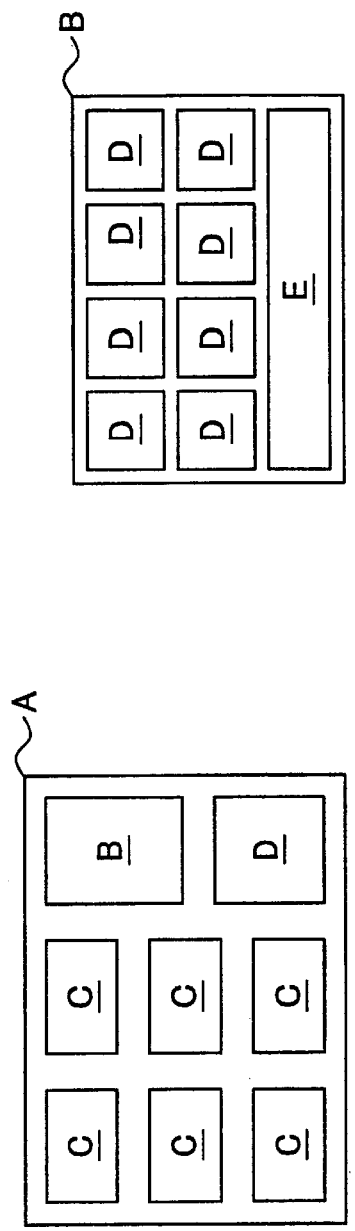
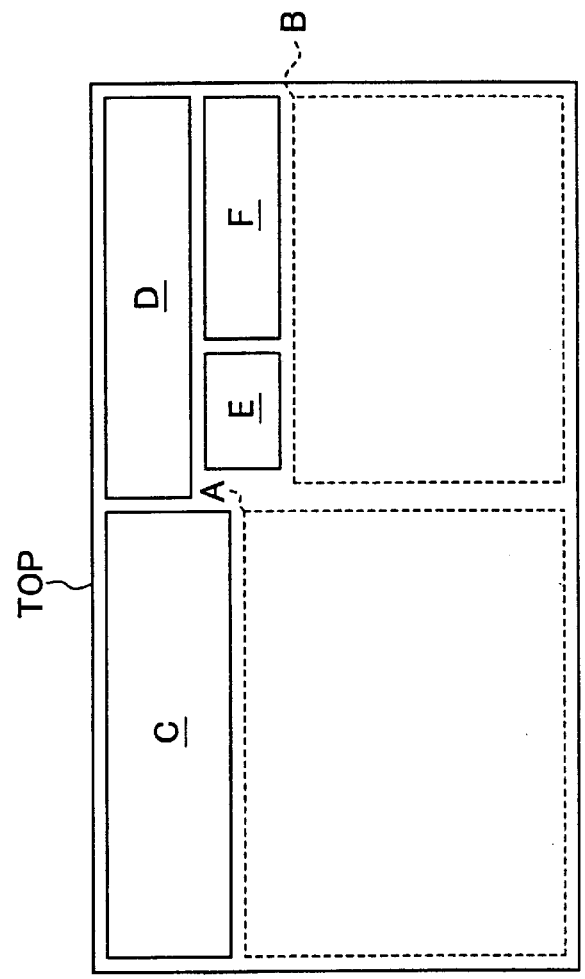

FIG.9
prior art

| NO. | KIND | LAYER | COORDINATES |
|---|---|---|---|
| 1 | REC | 1 | X1,Y1,X2,Y2 |
| 2 | POL | 1 | X3,Y3, ⋯ |
| 3 | REC | 1 | X4,Y4,X5,Y5 |
| 4 | REC | 2 | X6,Y6,X7,Y7 |
| 5 | PTH | 3 | X8,Y8,X9,Y9 |
| ⋮ | ⋮ | ⋮ | ⋮ |
| n | POL | 1 | Xa,Ya, ⋯ |

METHOD AND APPARATUS FOR MODIFYING FLATTENED DATA OF DESIGNED CIRCUIT PATTERN

BACKGROUND OF THE INVENTION

1. Field of the Invention

The present invention relates to a method and an apparatus for modifying data of a designed circuit pattern, the data being flattened with losing hierarchical structure.

2. Description of the Related Art

As advance of multi-functionality and high density pattern of semiconductor integrated circuits, the designed data volumes thereof have been increasing, which requires to perform modification of designed pattern data in a shorter time.

FIG. 6 is a schematic block diagram visually showing a cell arrangement included in designed data of a semiconductor integrated circuit.

For example, a semiconductor integrated circuit maker designs subcells C to F in a cell TOP of an entire chip while requesting an outside company to design a subcell A and another outside company to design a subcell B, and arranges the designed subcells A and B into the cell TOP. Generally speaking, CAD data formats of the designed cells TOP, A and B are different from each other, therefore the formats of these cells are converted into a standard format, for example, GDS2 format before incorporating the subcells A and B into the cell TOP. In each cell, names of its subcells are given independently of other cells. For example, the subcell C in the cell TOP and the subcell C in the subcell A are different in contents even though the names thereof are the same.

FIGS. 8(A) to 8(C) shows hierarchical structures of the respective subcells A, B and cell TOP of FIG. 6. Although the hierarchical structures are actually complex, those are simplified for easy explanation.

When the subcells A and B are incorporated into the cell TOP, the subcells A and B are flattened with losing their hierarchical structure since the cell TOP and subcells A and B generally have different formats from each other.

FIG. 7 visually shows a state where the subcells A and B are arranged in the cell TOP.

FIG. 9 shows flattened data (feature data) included in the cell TOP of FIG. 7, wherein each subcell includes data of a plurality of features.

In a case where a feature is a rectangle (REC), the feature is represented by coordinates of a diagonal point pair, in a case where a feature is a polygon (POL), the feature is represented by the coordinates of vertex locations and in a case where a feature is a electric line (PTH), the feature is represented by the coordinates of the both ends.

In FIG. 7, when modifying a feature in the subcell A, the data of the subcell A are extracted from the file of the cell TOP to make a separate file and an input apparatus is operated while watching a display image to select a feature to be modified and perform modification thereof.

However, in a case where a pattern of 100 contact holes each having the same size is modified, the contact holes have to be modified one by one with manual operation. Assuming that it takes about 10 sec to modify one contact hole, it totally takes about 20 min to modify all of them. This also holds in a similar way in a case where the subcells A and B are extracted from the cell TOP to make a single separate file and a plurality of the same features included therein are modified.

SUMMARY OF THE INVENTION

Accordingly, it is an object of the present invention to provide a method and an apparatus for modifying flattened pattern data of a designed circuit, capable of modifying the pattern data in a shorter time.

In one aspect of the present invention, there is provided a method for modifying a pattern data of a designed circuit using a computer, the pattern data having a plurality of feature data, comprising the steps of: (a) classifying the plurality of feature data into groups by the computer, each group having feature data of same shapes and same sizes; and (b) when a feature data is selected and modified, automatically modifying other feature data belonging to the same group in the same manner as the selected feature data.

With this configuration, by grouping and automatic modification, the pattern data can be modified in a shorter time.

Other aspects, objects, and the advantages of the present invention will become apparent from the following detailed description taken in connection with the accompanying drawings.

BRIEF DESCRIPTION OF THE DRAWINGS

FIG. 2 is an illustration of feature data included in a cell to be modified.

FIG. 6 is a schematic block diagram visually showing a prior art cell arrangement included in pattern data of a semiconductor integrated circuit.

FIG. 9 is an illustration of feature data included in the flattened cell TOP of FIG. 7.

DESCRIPTION OF THE PREFERRED EMBODIMENTS

Figure 1:
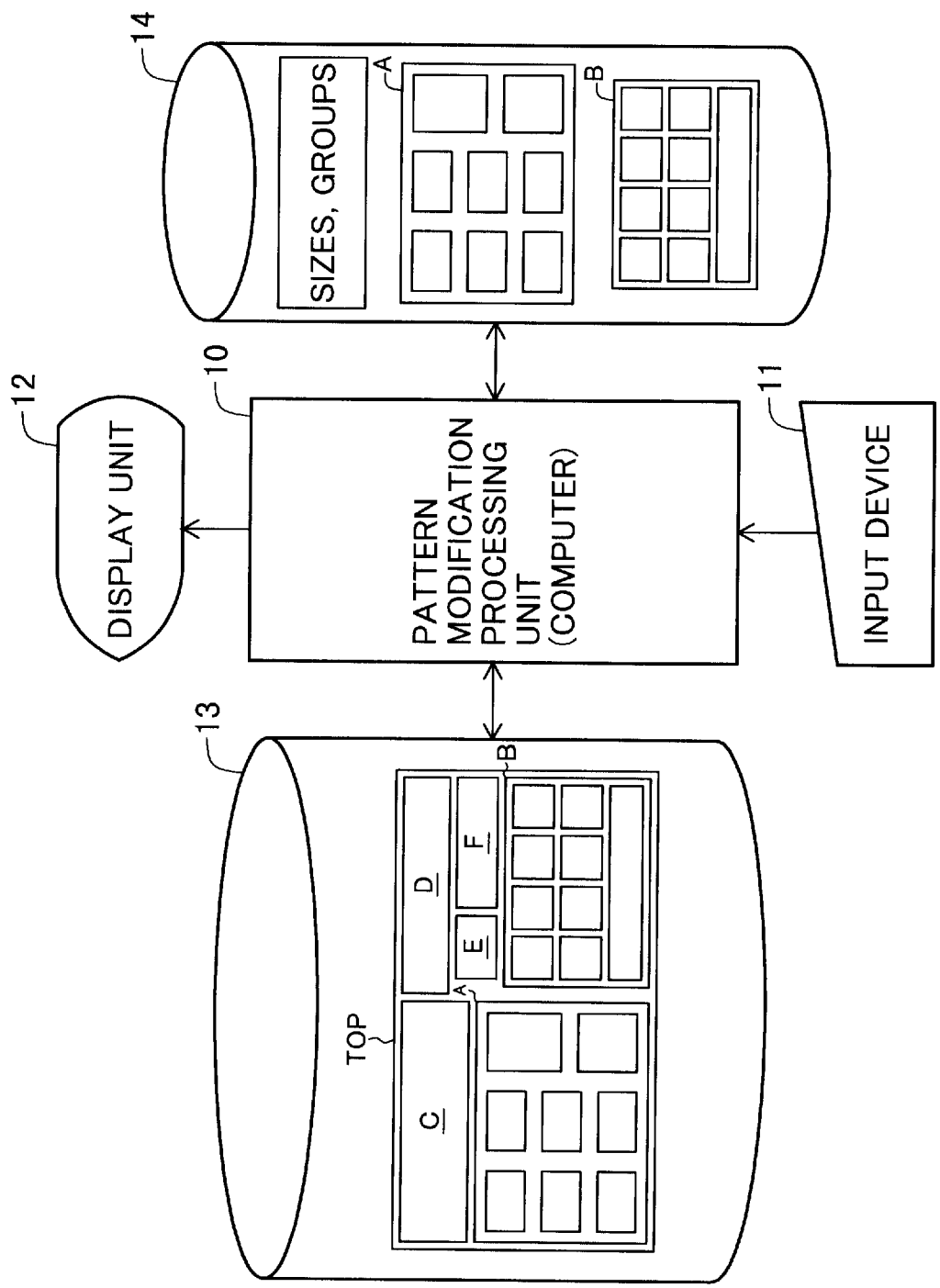
FIG. 1 is a schematic block diagram showing a pattern data modifying apparatus of one embodiment according to the present invention.

Referring now to the drawings, wherein like reference characters designate like or corresponding parts throughout several views, preferred embodiments of the present invention are described below.

FIG. 1 is a schematic block diagram showing a pattern data modifying apparatus of one embodiment according to the present invention. This apparatus is a computer system comprising a pattern modification processing unit 10 that is a computer in which a pattern modifying program is installed, and I/O units connected thereto including an input device 11, a display unit 12, and storage devices 13 and 14.

Figure 7:
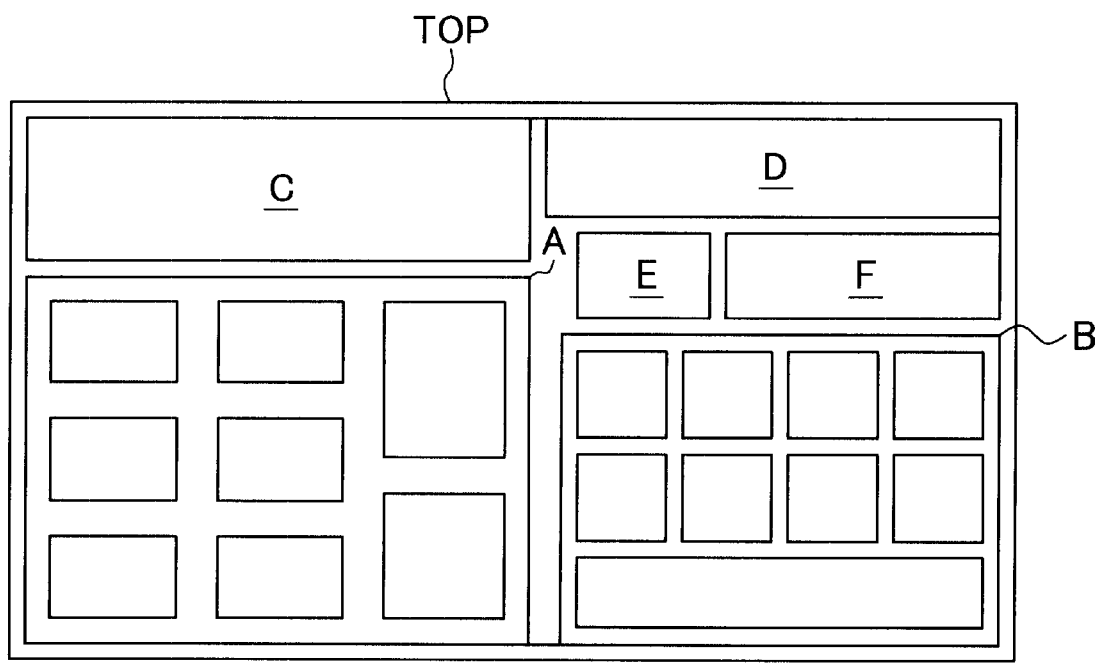
FIG. 7 is a diagram visually showing a state where subcells A and B are arranged in a cell TOP included in the pattern data.
Figure 8A:
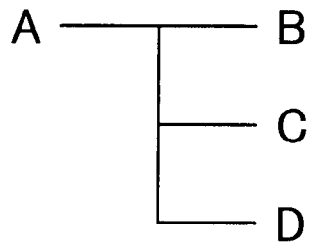
FIGS. 8(A) to 8(C) are diagrams showing hierarchical structures of the respective subcells A, B and cell TOP of FIG. 6.
Figure 8B:
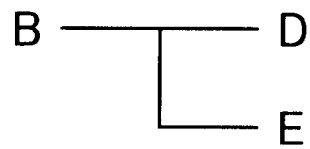
Figure 8C:
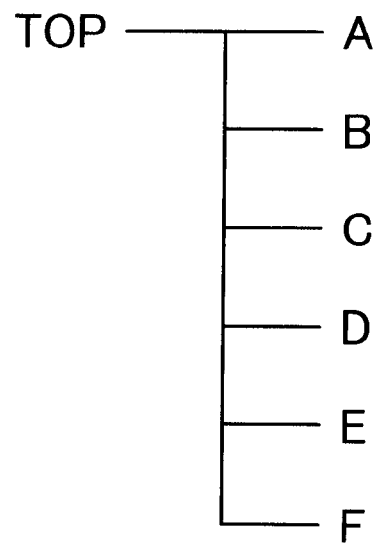

In the storage device 13, for example, designed data of the cell TOP shown in FIG. 7 are stored and to be more concrete, feature data as shown in FIG. 9 are stored.

The input device 11 is operated while watching a display on the display unit 12 to select, for example, the subcells A and B included in the cell TOP as objects to be modified. The pattern modification processing unit 10 responds to this selection to perform a processing shown in FIG. 4. That is, the pattern modification processing unit 10 extracts the subcells A and B from the cell TOP to make a separate file and store the separate file into the storage device 14. Furthermore, to each feature data shown in FIG. 9 stored in the storage device 14, data of a characteristic size and a group are attached to produce data as shown in FIG. 2.

Figure 3A:
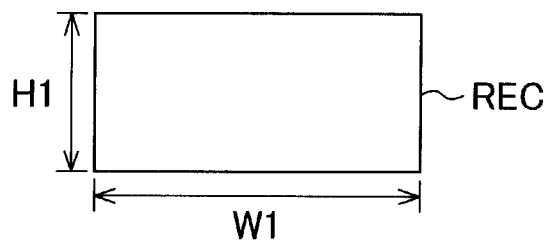
FIGS. 3(A) to 3(C) are illustrations of sizes of a rectangle, a polygon and an electric line, respectively.
Figure 3B:
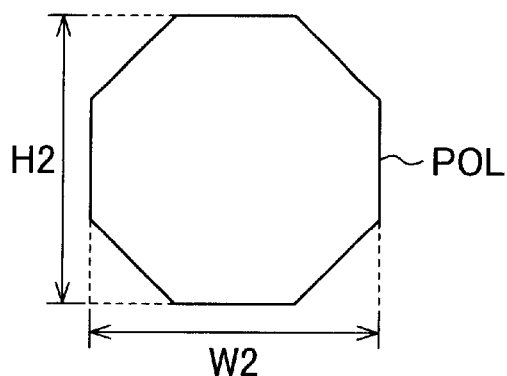
Figure 3C:
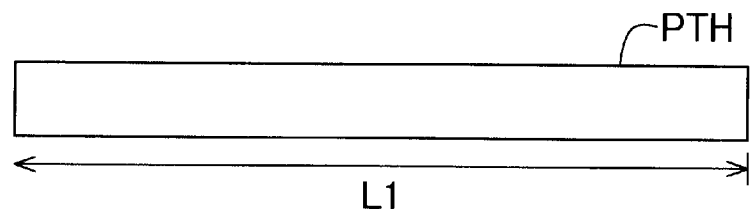

FIGS. 3(A) to 3(C) show characteristic sizes of an rectangle REC, a polygon POL and an electric line PTH.

The characteristic sizes of the rectangle REC are a lateral length W1 and a longitudinal length H1. The characteristic sizes of the polygon are the lateral length W2 and the longitudinal length H2 of the rectangle inscribed by the polygon. The characteristic size of the electric line PTH is the line length thereof, and the line width thereof is given commonly in each layer.

A mask is manufactured for each layer.

When features have the same kind and size in the same layer, these features are named with the same group name. For example, NO. 1 and NO. 3 features have the same kind, layer and size, therefore they have the same group name G1.

Figure 4:
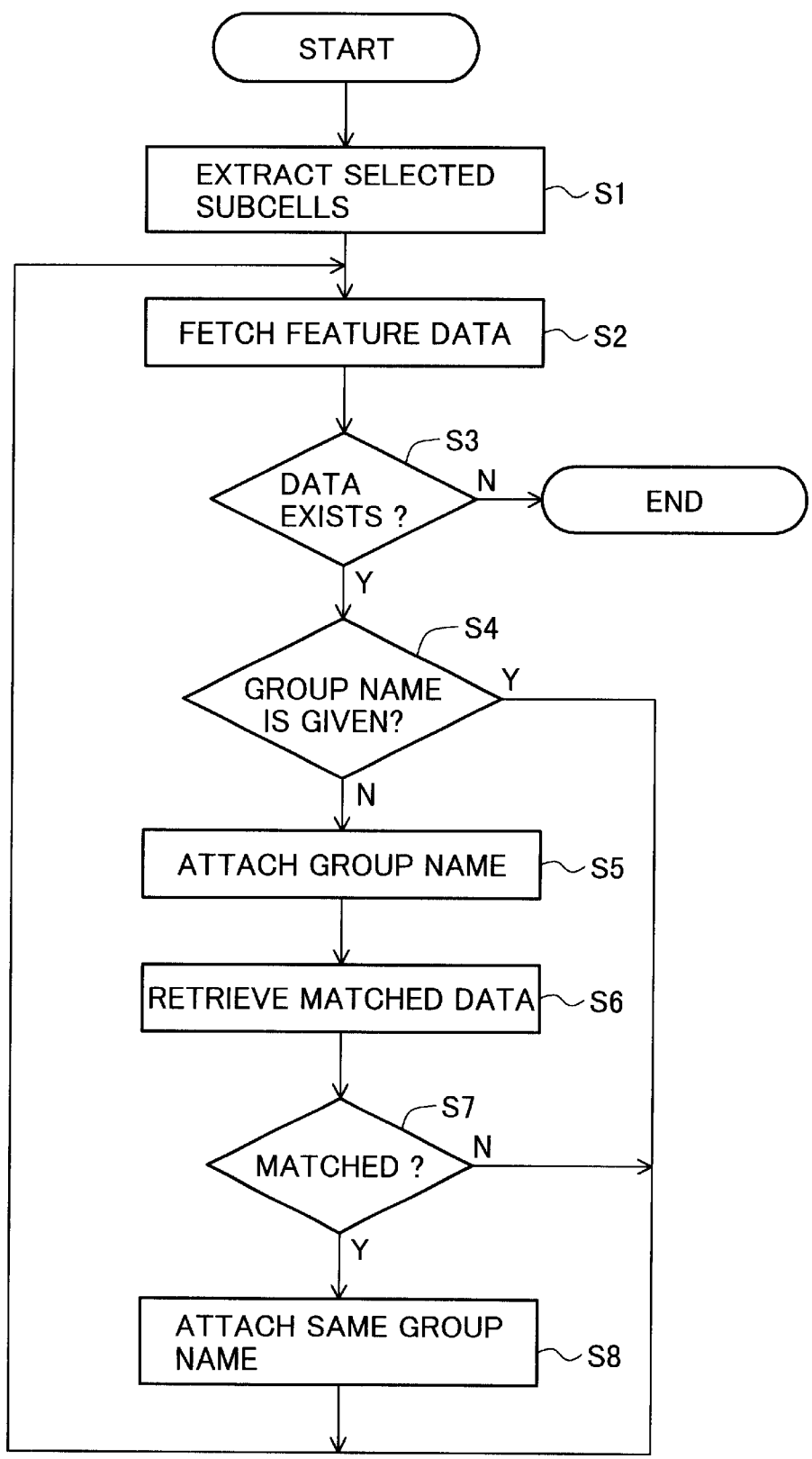
FIG. 4 is a flow chart showing the steps of a grouping process performed by the pattern modification processing unit 10 of FIG. 1.

Next, a grouping processing of FIG. 4 will be described.

(S1) The selected subcells A and B having feature data are extracted from the cell TOP to store them into the storage device 14 as a separate file.

(S2) The next one of the feature data is fetched from this file. For the first time, the NO. 1 feature data of FIG. 2 is fetched.

(S3) If there is no feature data to be fetched, then the process is terminated, or else proceeds to step S4.

(S4) If a group name is already given to this feature data, then the process returns to step S2, or else proceeds to step S5.

(S5) A group name is attached to the feature data fetched in step 2. For example, a group name G1 is attached to the NO.1 feature of FIG. 2.

(S6) Figure data having the same kind, layer and size as those of the feature data in step S5 are retrieved.

(S7) If no feature data is found in step 2, then the process returns to step S2, or else proceeds to step S8.

(S8) The same group name as that attached in step S5 is attached to the retrieved feature data in step S6. For example, when the NO. 3 feature data of FIG. 2 has the same kind, size and layer as that of the NO. 1 feature data, the group name G1 is attached to the NO. 3 feature data.

Next, the process returns to step S2 to fetch next feature data, for example, the NO. 2 feature data.

Figure 5:
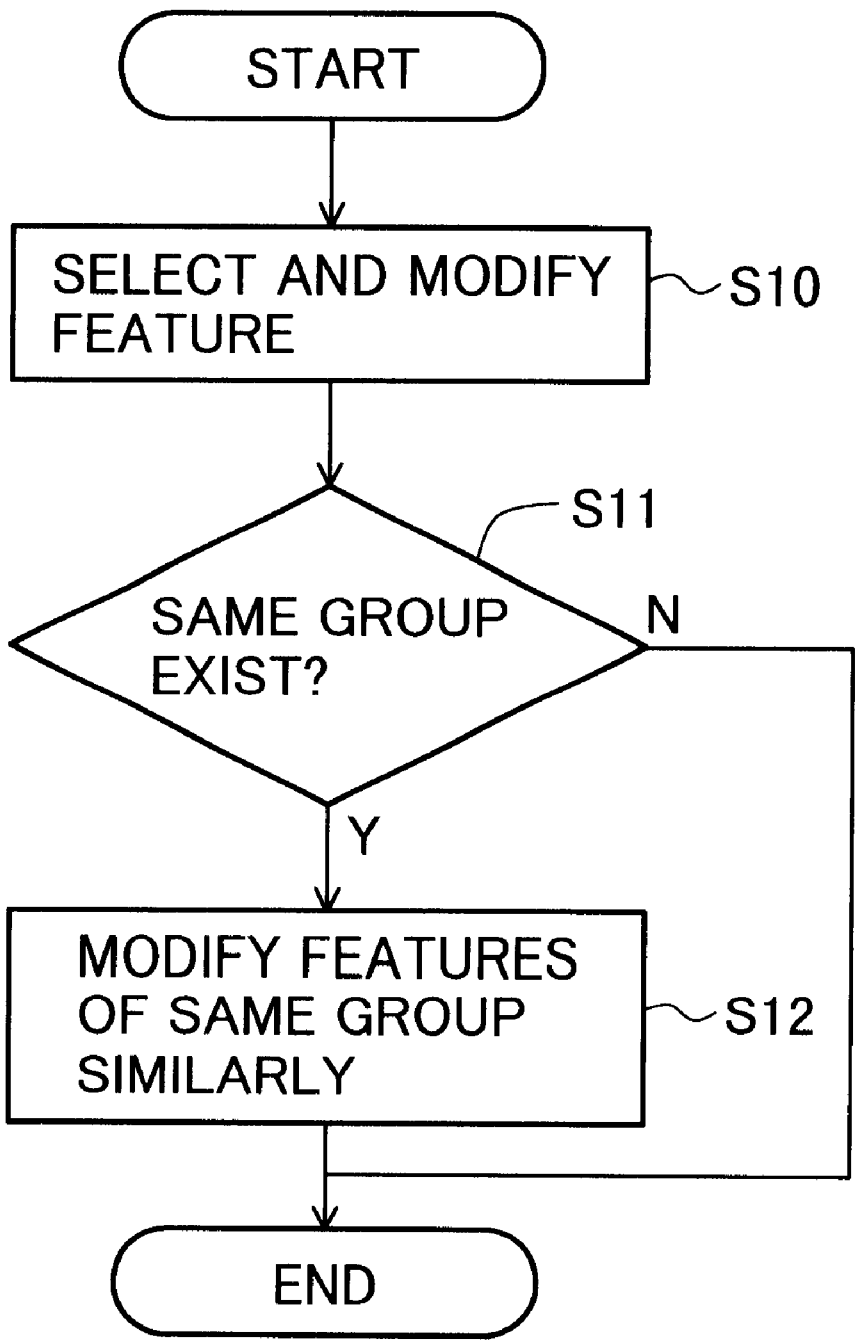
FIG. 5 is a flow chart showing the steps of a pattern modification process performed by the pattern modification processing unit 10 of FIG. 1 subsequent to the process of FIG. 4.

After such a grouping process is finished, a modification process shown in FIG. 5 is performed by the pattern modification processing unit 10.

(S10) An operator operates the input device 11 with watching a display on the display unit 12 to select a feature to be modified and perform modification thereon.

(S11) if there are features in FIG. 2 of the same group name as that of the feature having been modified in step S10, then the process proceeds to step S12, or else terminating the process for modification on the selected feature in step S10.

(S12) The same modifications as in step S10 on the features of the same group are performed automatically by the pattern modification processing unit 10.

For example, in a case where in step S10 a rectangular contact hole having a side of 1 mm is modified by the operator into a rectangle having a side of 0.9 mm, each of the same features as the contact hole having a side of 1 mm is automatically modified into a rectangle having a side of 0.9 mm by the pattern modification processing unit 10. With such a method, a modification processing for designed pattern data is performed in a short time. For example, in the prior art it took about 10 seconds to modify each one of 100 same features, namely it took about 20 minutes totally for the 100 same features, while the modification can be completed totally in about 10 seconds according to the present embodiment.

In FIG. 1, the subcells A and B of the cell TOP stored in the storage device 13 are replaced with the subcells A and B in the storage device 14 after the modifications. At this replacement, data of sizes and groups are removed. The removed data are stored in the storage device 14, and reused when the subcells A and B are again selected as an object to be modified.

Although preferred embodiments of the present invention has been described, it is to be understood that the invention is not limited thereto and that various changes and modifications may be made without departing from the spirit and scope of the invention.

Note that various modifications or alterations of the above embodiment are included in the present invention.

For example, in a case of polygon data, the above size may be replaced with the vertex coordinate set thereof obtained by moving the polygon to such a new position parallel to itself that coordinates of the origin fit to (0, 0). Further, at least one cell having a plurality of features has only to be extracted from the cell TOP for modification.

What is claimed is:

1. A method for modifying a pattern data of a designed circuit using a computer, said pattern data having a plurality of feature data, comprising the steps of:
   (a) classifying said plurality of feature data into groups by said computer, each group having feature data of same shapes and same sizes; and
   (b) when a feature data is selected and modified, automatically modifying other feature data belonging to the same group in the same manner as the selected feature data.

2. The method of claim 1, wherein each feature data has a kind of feature, a layer corresponding to a mask to be manufactured; and coordinate values, and
   wherein the step (a) comprises the steps of:
   obtaining a size of each length of two adjacent sides of a rectangle inscribed by a feature corresponding to one of said plurality of feature data;
   attaching the sizes to said one; and
   if there is another feature, corresponding to another of said plurality of feature data, whose kind, layer and coordinate values are the same as that of said one, attaching the same group name to said one and said another of said plurality of feature data.

3. An apparatus for modifying a pattern data of a designed circuit, said pattern data having a plurality of feature data, said apparatus comprising a computer for performing the steps of:
   (a) classifying said plurality of feature data into groups by said computer, each group having feature data of same shapes and same sizes; and
   (b) when a feature data is selected and modified, automatically modifying other feature data belonging to the same group in the same manner as the selected feature data.

4. The apparatus of claim 3, wherein each feature data has a kind of feature, a layer corresponding to a mask to be manufactured; and coordinate values, and wherein the step (a) comprises the steps of:

obtaining a size of each length of two adjacent sides of a rectangle inscribed by a feature corresponding to one of said plurality of feature data;

attaching the sizes to said one; and if there is another feature, corresponding to another of said plurality of feature data, whose kind, layer and coordinate values are the same as that of said one, attaching the same group name to said one and said another of said plurality of feature data.

5. A computer program product, comprising:

a computer readable storage medium having a computer program stored thereon for causing a computer to modify a pattern data of a designed circuit, said pattern data having a plurality of feature data, wherein said computer program causes said computer to perform the steps of:

(a) classifying said plurality of feature data into groups by said computer, each group having feature data of same shapes and same sizes; and (b) when a feature data is selected and modified, automatically modifying other feature data belonging to the same group in the same manner as the selected feature data.

6. The computer program product of claim 5, wherein each feature data has a kind of feature, a layer corresponding to a mask to be manufactured; and coordinate values, and wherein the step (a) comprises the steps of:

obtaining a size of each length of two adjacent sides of a rectangle inscribed by a feature corresponding to one of said plurality of feature data;

attaching the sizes to said one; and if there is another feature, corresponding to another of said plurality of feature data, whose kind, layer and coordinate values are the same as that of said one, attaching the same group name to said one and said another of said plurality of feature data.

* * * * *